US010597521B2

(12) United States Patent
Lu

(10) Patent No.: US 10,597,521 B2
(45) Date of Patent: Mar. 24, 2020

(54) CURABLE COMPOSITION COMPRISING AN ETHYLENE POLYMER, A MONOPEROXYCARBONATE AND A T-ALKYL HYDROPEROXIDE

(71) Applicant: Arkema France, Colombes (FR)

(72) Inventor: Chao Lu, Changshu Jiangsu (CN)

(73) Assignee: Arkema France, Colombes (FR)

( * ) Notice: Subject to any disclaimer, the term of this patent is extended or adjusted under 35 U.S.C. 154(b) by 0 days.

(21) Appl. No.: 16/330,804

(22) PCT Filed: Sep. 8, 2017

(86) PCT No.: PCT/EP2017/072659
§ 371 (c)(1),
(2) Date: Mar. 6, 2019

(87) PCT Pub. No.: WO2018/046700
PCT Pub. Date: Mar. 15, 2018

(65) Prior Publication Data
US 2019/0194434 A1     Jun. 27, 2019

(30) Foreign Application Priority Data
Sep. 8, 2016 (FR) ..................... 16 58362

(51) Int. Cl.
| | | |
|---|---|---|
| *C08L 23/06* | (2006.01) | |
| *C08L 23/08* | (2006.01) | |
| *C08K 5/14* | (2006.01) | |
| *H01L 31/048* | (2014.01) | |
| *C08K 5/109* | (2006.01) | |
| *C08K 5/11* | (2006.01) | |
| *C08K 5/12* | (2006.01) | |
| *C08K 5/3415* | (2006.01) | |
| *C08K 5/3492* | (2006.01) | |

(52) U.S. Cl.
CPC .......... *C08L 23/0853* (2013.01); *C08K 5/109* (2013.01); *C08K 5/14* (2013.01); *C08L 23/06* (2013.01); *H01L 31/0481* (2013.01); *C08K 5/11* (2013.01); *C08K 5/12* (2013.01); *C08K 5/3415* (2013.01); *C08K 5/34924* (2013.01); *C08K 2201/014* (2013.01); *C08L 2201/02* (2013.01); *C08L 2203/204* (2013.01); *C08L 2203/206* (2013.01); *C08L 2207/04* (2013.01)

(58) Field of Classification Search
CPC ......... C08K 5/14; C08L 23/08; C07C 409/02; C07C 409/20; C08F 8/06; C08F 10/02; C08F 2810/20
See application file for complete search history.

(56) References Cited

U.S. PATENT DOCUMENTS

| | | | | |
|---|---|---|---|---|
| 3,939,133 A | * | 2/1976 | Roodvoets | ............... C08K 5/14 525/332.5 |
| 4,015,058 A | * | 3/1977 | Schober | .................. C08K 5/14 525/387 |
| 4,025,706 A | * | 5/1977 | Schober | .................. C08K 5/14 524/100 |
| 4,873,274 A | * | 10/1989 | Cummings | ....... C08F 299/0442 523/500 |
| 5,272,236 A | | 12/1993 | Lai et al. | |
| 5,278,272 A | | 1/1994 | Lai et al. | |
| 5,986,028 A | | 11/1999 | Lai et al. | |
| 2008/0176994 A1 | * | 7/2008 | Allermann | ............... C08K 5/14 524/563 |
| 2009/0023867 A1 | | 1/2009 | Nishijima et al. | |
| 2011/0033714 A1 | | 2/2011 | Cartier et al. | |
| 2011/0152446 A1 | * | 6/2011 | Keromnes | .................. C08J 3/24 524/557 |
| 2014/0334515 A1 | * | 11/2014 | Hidalgo | ............. G01N 25/4866 374/10 |

FOREIGN PATENT DOCUMENTS

| | | |
|---|---|---|
| EP | 2242647 A1 | 10/2010 |
| JP | 2011/140588 A | 7/2011 |
| WO | 2009101369 A1 | 8/2009 |
| WO | 2010/007315 A2 | 1/2010 |
| WO | 2016/012718 A1 | 1/2016 |

OTHER PUBLICATIONS

ISA/EP; International Search Report & Written Opinion for International Application No. PCT/EP2017/072659 dated Nov. 20, 2017.
K. Thaworn, et al. "Effects of Organic Peroxides on the Curing Behavior of EVA Encapsulant Resin", Open Journal of Polymer Chemistry, May 2012, vol. 2, pp. 77-85.

* cited by examiner

*Primary Examiner* — Robert C Boyle
(74) *Attorney, Agent, or Firm* — NK Patent Law

(57) ABSTRACT

The present invention pertains to a curable composition comprising (a) at least one ethylene polymer, (b) less than 2 parts by weight of at least one monoperoxycarbonate for 100 parts by weight of constituent (a), (c) from 0.4 to less than 4 part by weight of at least one t-alkyl hydroperoxide for 100 parts by weight of constituent (b). It is also directed to a method for preventing scorching of a curable composition comprising an ethylene polymer, by adding a specific amount of t-alkyl hydroperoxide thereto and to a method for manufacturing a scorch-protected material.

13 Claims, No Drawings

page 1 of 2 …

CURABLE COMPOSITION COMPRISING AN ETHYLENE POLYMER, A MONOPEROXYCARBONATE AND A T-ALKYL HYDROPEROXIDE

CROSS-REFERENCE TO RELATED APPLICATIONS

This application is a U.S. National Stage application of International Application No. PCT/EP2017/072659, filed on Sep. 8, 2017, which claims the benefit of French Patent Application No. 1658362, filed Sep. 8, 2016.

The present invention pertains to a curable composition comprising an ethylene polymer, such as an ethylene/vinyl acetate copolymer. It is also directed to a method for preventing scorching of a curable composition comprising such an ethylene polymer.

Ethylene/vinyl acetate (EVA) is a copolymer widely used, inter alia, in solar panels, as an encapsulating material to protect solar cells (and especially the semiconductors contained therein) from outdoor environmental elements, especially moisture and UV radiation, and to provide electrical insulation. EVA indeed provides a good transparency and adhesion to the substrates of the photovoltaic (PV) module, together with a high resistivity and good moisture-barrier effect. These properties may alternatively be used in the manufacture of laminated glass.

It is common practice to crosslink these EVA copolymers in order to improve their thermal stability, especially their creep strength, their adhesion to the substrates and their weathering degradation resistance. For this purpose, various crosslinking agents have been used to date in the EVA formulation, which are typically peroxides such as dicumyl peroxide (DCP), peroxyesters, peroxyketals, peroxycarbonates and mixtures thereof. An example of monoperoxycarbonate used for this purpose is OO-t-butyl-O-2-ethylhexyl-monoperoxycarbonate (TBEC). This peroxide has proven to require a lower operating temperature than DCP, without providing the resulting product with a yellowish colour. It is thus used in the manufacture of photovoltaic modules (see for instance K. Thaworn et al., Open Journal of Polymer Chemistry, 2012, 2, 77-85). The Applicant has further shown that the addition of OO-t-amyl-O-2-ethylhexyl-monoperoxycarbonate (TAEC) to TBEC shortened the reaction time and improved the crosslinking density of EVA, which resulted in an increased tensile strength and a high modulus of the products made from the crosslinked EVA (WO 2010/007315).

During the laminating process of the PV module, the EVA composition is first deposited onto the frontsheet, then covered by the solar cells and deposited again thereon, before applying the backsheet, so as to obtain a PV module which is then heated at a certain high temperature for some time and pressed into place, whereby the EVA composition is cured.

It has been found that the EVA composition was susceptible to premature crosslinking in the barrel or die head of the extruder in which it is processed, prior to the formation of the above laminate. This phenomenon, which is called "scorching", results in irregularities in the EVA sheet thus formed, which in turn impairs the appearance and properties of the PV module. In some cases, pressure may also build up in the extruder, which requires discontinuing the extrusion process. This has especially been observed in the case of EVA having a relatively low melt-flow index and/or a relatively narrow molecular weight distribution (source: U.S. Pat. No. 4,015,058). However, on the other hand, in order to achieve commercially feasible process speeds, it is necessary that once the EVA sheets have been shaped and then heated above the thermal decomposition temperature of the peroxides, crosslinking proceeds as rapidly as possible in order to increase the economics of the process and also minimize possible side reactions.

The same phenomenon of premature crosslinking is also observed in polyolefin elastomers (POE) which may be used instead of EVA.

Various solutions have been proposed to date to prevent scorching of EVA compositions. For instance, it has been suggested to add polymerization inhibitors to the EVA composition. However, unwanted yellowing has been noted. Alternatively, it has been proposed in U.S. Pat. No. 4,015,058 to add at least 1 wt. % of cumene hydroperoxide and/or tertiary butyl hydroperoxide to dicumyl peroxide (DCP). However, the crosslinking rate obtained with this system is not high enough for industrial applications, in particular in the manufacture of PV modules, due to the presence of DCP. Because of the aromatic structure of DCP, the yellowing problems also still remain.

Another solution has been provided in JP2011-140588, which is said to be appropriate for the manufacture of PV modules. It consists in adding from 4 to 50 parts by weight of a hydroperoxide, such as t-butyl hydroperoxide, to 100 parts by weight of an organic peroxide selected from a monoperoxycarbonate, a dialkyl peroxide, a peroxyketal and a peroxyester. Although this solution allows overcoming the drawbacks associated with the use of DCP, it has been found in JP2011-140588 that the above amounts of hydroperoxide negatively affected EVA crosslinking density. In this respect, it was suggested in this document to increase the total amount of monoperoxycarbonate and hydroperoxide while keeping the ratio of hydroperoxide to monoperoxycarbonate constant, i.e. around 20% (see Table 1).

Surprisingly, the inventor has found that the crosslinking density of EVA or POE can be improved by a specific weight ratio of hydroperoxide to monoperoxycarbonate, i.e. from 0.4 to less than 4%. Moreover, he found a marked increase in the scorch preventing effect of the hydroperoxide at these low weight ratios, contrary to what was expected in JP2011-140588, without impairing the rate of the crosslinking reaction, even with low amount of the crosslinking agent. Furthermore, it was observed that the film homogeneity was satisfactory with substantially no bubbles. In this respect, it should be noted that bubbles formed by the evaporation of water entrapped within the film at extrusion temperatures above 100° C. are responsible for surface defects which negatively affect the resistivity of the film. This is particularly damaging in the case where the film is to be used as an encapsulating material in PV modules.

The compositions comprising an ethylene polymer such as EVA and the above peroxides may thus be processed in extruding devices at fast throughput rates without experiencing scorching.

It should be noted that monoperoxycarbonates are also useful for crosslinking other ethylene polymers such as polyolefin elastomers, e.g. polydiene elastomers, including ethylene-propylene-diene (EPDM) elastomers and also polyethylene, including low density and high-density polyethylene, which are used, inter alia, in the manufacture of wire and cable insulation, pipes and hoses (including pipes for automobile radiators, drinkable water and under-floor heating, for instance), roller coverings, rotational moldings and foamed articles. The composition of this invention is thus also useful in these applications, e.g. to prevent scorching while extruding the composition as an insulation sheath onto an electrical conductor.

More specifically, this invention is directed to a curable composition comprising:

(a) at least one ethylene polymer,
(b) less than 2 parts by weight of at least one monoperoxycarbonate for 100 parts by weight of constituent (a),
(c) from 0.4 to less than 4 parts by weight of at least one t-alkyl hydroperoxide for 100 parts by weight of constituent (b).

The ethylene polymer used as constituent (a) in this invention may be an ethylene homopolymer or preferably an ethylene copolymer. Examples of ethylene copolymers are those made from both ethylene monomers and at least one other monomer selected from hydrocarbons having at least one unsaturation such as methylene, propylene, butene, pentene, hexene, heptene, octene, butadiene, isoprene and styrene; acryl monomers such as acrylic acid, methacrylic acid, alkyl methacrylate and alkyl acrylate, wherein the alkyl group may be selected from methyl, ethyl, propyl or butyl, for instance; and vinyl monomers such as vinyl acetate. Usually, these copolymers comprise at least 30 percent by weight of ethylene and at most 70 weight percent of the other monomer(s).

According to a preferred embodiment, the ethylene copolymer is an ethylene/vinyl acetate (EVA) copolymer. The EVA copolymer may comprise from 15 to 60 wt %, and preferably from 25 to 45 wt. %, of vinyl acetate (VA) monomer. Examples of such EVA copolymers are available under the trade name "Evatane® 18-150" and "Evatane® 40-55" from ARKEMA.

Other ethylene polymers that may be used in the invention have been disclosed, e.g., in EP 2 242 647. They comprise a functionalized polyolefin, such as a homopolymer of ethylene or a copolymer of ethylene with an alkyl(meth) acrylate or vinyl acetate, which may be functionalized either by grafting of by copolymerization with maleic anhydride or glycidyl methacrylate. This functionalized polyolefin may optionally be mixed with a copolymer of ethylene/carboxylic acid vinyl ester such as EVA.

In a preferred embodiment, the ethylene polymer of the invention is a polyolefin elastomer.

"Polyolefin" is a polymer derived from olefin, e.g., ethylene, propylene, butene, hexene, octene, etc. "Derived from" means, in the context of this definition, that the units in the polymer backbone and/or polymer branches are a result of the polymerization or copolymerization of the monomers from which the polymer is made. Preferably, said polyolefin is a polyolefin elastomer.

"Polyolefin elastomer" (POE) and like terms mean an elastomeric polymer derived from olefin, e.g. ethylene, propylene, butene, hexene, octene, etc.

By "elastomer" it is meant a polymer being able to be subjected to a uniaxial deformation at ambient temperature, preferably of at least 20% for 15 minutes, and of recovering, once this stress has been removed, its initial dimension, preferably with a remnant deformation of less than 5% of its initial dimension.

Preferably, said polyolefin elastomers have an alpha-olefin content of at least 15 wt %, preferably at least 20 wt % and even more preferably at least 25 wt % based on the weight of the polymer.

Preferably, said polyolefin elastomers have an alpha-olefin content of less than 50 wt %, preferably less than 45 wt %, more preferably less than 40 wt % and even more preferably less than 35 wt % based on the weight of the polymer.

The alpha-olefin content can be measured by $^{13}$C nuclear magnetic resonance (NMR) spectroscopy using the procedure described in Randall (Rev. Macromol Chem. Phys., C29 (2 and 3)).

The alpha-olefin is preferably a $C_{3-20}$ linear, branched or cyclic alpha-olefin.

Examples of $C_{3-20}$ alpha-olefins include propene, 1-butene, 4-methyl-1-pentene, 1-hexene, 1-octene, 1-decene, 1-dodecene, 1-tetradecene, 1-hexadecene, and 1-octadecene. The alpha-olefins can also contain a cyclic structure such as cyclohexane or cyclopentane, resulting in an alpha-olefin such as 3-cyclohexyl-1-propene (allyl cyclohexane) and vinyl cyclohexane.

Some cyclic olefins, such as norbornene and related olefins, are considered in the present invention as alpha-olefins and can be used in place of some or all of the alpha-olefins described above.

As polyolefin elastomer, one can cites ethylene/propylene, ethylene/1-butene, ethylene/1-hexene, in particular very low density polyethylene (VLDPE) (e.g., FLEXOMER® ethylene/1-hexene polyethylene made by The Dow Chemical Company), ethylene/1-octene, ethylene/styrene, ethylene/propylene/1-octene, ethylene/propylene/l-butene, ethylene/1-butene/1-octene, and ethylene/1-butene/styrene.

The more preferred polyolefin copolymers are the homogeneously branched linear and substantially linear ethylene copolymers. The substantially linear ethylene copolymers are especially preferred, and are more fully described in the American patents U.S. Pat. Nos. 5,272,236, 5,278,272 and 5,986,028.

Specific examples of homogeneously branched, linear ethylene/alpha-olefin copolymers one can cites TAFMER® from Mitsui Petrochemicals Company Limited, EXACT® from Exxon Chemical Company, AFFINITY® and ENGAGE® from The Dow Chemical Company.

The polyolefin elastomers of this invention also include propylene, 1-butene and other alkene-based copolymers, e.g., copolymers comprising a majority of units derived from propylene and a minority of units derived from another alpha-olefin (including ethylene). Exemplary polypropylenes useful in the practice of this invention include the VERSIFY® polymers available from The Dow Chemical Company, and the VISTAMAXX® polymers available from ExxonMobil Chemical Company.

Preferably, the polyolefin elastomers of the invention have a glass transition temperature (Tg) of less than −35° C., preferably less than −40° C., more preferably less than −45° C. and even more preferably less than −50° C. as measured by differential scanning calorimetry (DSC) using the procedure of ASTM D-3418-03.

Preferably, the polyolefin elastomers of the invention have a melt index (MI as measured by the procedure of ASTM D-1238 (190° C./2.16 kg) of less than 100 g/10 minutes, preferably less than 75 g/10 minutes, more preferably less than 50 g/10 minutes and even more preferably less than 35 g/10 minutes.

Preferably, the polyolefin elastomers of the invention have a melt index of at least 1 g/10 minutes, more preferably of at least 5 g/10 minutes.

Preferably, the polyolefin elastomers of the invention have a density of less than 0.90 g/cc, preferably less than 0.89 g/cc, more preferably less than 0.885 g/cc, even more preferably less than 0.88 g/cc and even more preferably less than 0.875 g/cc.

Preferably, the polyolefin elastomers of the invention have a density greater than 0.85 g/cc, and more preferably greater than 0.86, g/cc.

Said density is preferably measured by the procedure of ASTM D-792.

The ethylene polymer is mixed with at least one monoperoxycarbonate. This peroxide compound may be a OO-t-alkyl-O-alkyl monoperoxycarbonate, preferably selected from the group consisting of: OO-t-butyl-O-2-ethylhexyl-monoperoxycarbonate (TBEC), OO-t-butyl-O-2-isopropyl-monoperoxycarbonate (TBIC), OO-t-amyl-O-2-ethylhexyl-monoperoxycarbonate (TAEC), OO-t-amyl-O-2-isopropyl-monoperoxycarbonate (TAIC) and mixtures thereof. These monoperoxycarbonates are available under the trade name Luperox® or Lupersol® supplied by ARKEMA.

Preferred monoperoxycarbonates are TAEC and TBEC, mixture thereof and mixture of TAEC and TAIC. More preferred monoperoxycarbonates are TAEC and TBEC. According to an embodiment of the invention, a mixture of TBEC and TAEC is used as constituent (b).

Preferably, when a mixture of O,O-tert-butyl-O-(2-ethylhexyl)monoperoxycarbonate (TBEC) and O,O-tert-amyl-O-(2-ethylhexyl) monoperoxycarbonate (TAEC) is used, the ratio by mass of O,O-tert-butyl-O-(2-ethylhexyl)monoperoxycarbonate (TBEC) to O,O-tert-amyl-O-(2-ethylhexyl) monoperoxycarbonate (TAEC) is within the range from 0.1:99.9 to 60:40, more preferably from 1:99 to 50:50, more preferably from 10:90 to 30:70 and even more preferably from 15:85 to 25:75 and even more preferably is around 20:80 respectively.

Alternatively, said ratio is around 50:50.

Preferably, when a mixture of O,O-tert-amyl-O-2-isopropyl-monoperoxycarbonate (TAIC) and O,O-tert-amyl-O-(2-ethylhexyl) monoperoxycarbonate (TAEC) is used, the ratio by mass of O,O-tert-amyl-O-2-isopropyl-monoperoxycarbonate (TAIC) to O,O-tert-amyl-O-(2-ethylhexyl) monoperoxycarbonate (TAEC) is within the range from 20:80 to 99:1, more preferably from 30:70 to 80:20, more preferably from 50:50 to 70:30 and even more preferably from 55:45 to 65:35 and even more preferably is around 60:40 respectively.

Alternatively, said ratio is around 50:50.

Preferably, the amount of constituent (b) in the composition of the invention may range from 0.1 to less than 2 parts by weight, preferably from 0.2 to 1.5, more preferably from 0.3 to 1, more preferably from 0.4 to 1, more preferably from 0.4 to 0.7 and even more preferably around 0.5 parts by weight, for 100 parts by weight of constituent (a).

The third component (c) of the composition according to this invention is a t-alkyl hydroperoxide, which may be selected from the group consisting of t-butyl hydroperoxide (TBHP), t-amyl hydroperoxide (TAHP), t-hexyl hydroperoxide (THHP), 1,1,3,3-tetramethylbutyl hydroperoxide (TOHP), paramenthane hydroperoxide (PMHP), 2,5-dimethyl-2,5-di-hydroperoxide (2,5-2,5) and mixtures thereof. Preferably, the t-alkyl hydroperoxide is TAHP.

The amount of constituent (c) in the composition of this invention preferably ranges from 0.4 to less than 4 parts by weight, preferably from 0.5 to 3.5, preferably from 0.5 to 3, more preferably from 0.5 to 2 and even more preferably approximately 1 part by weight of at least one t-alkyl hydroperoxide for 100 parts by weight of constituent (b).

The composition of the invention may further include a coagent, which is not an organic peroxide.

Advantageously, said coagent bears at least one carbamate, maleimide, acrylate, methacrylate or allyl functional group. Allyl carboxylates may be used, which may be selected in the group consisting of: the allyl, diallyl and triallyl type.

Said coagent may be chosen in the group consisting of divinylbenzene, diisopropenyl benzene, alpha methylstyrene, alpha-methylstyrene dimer, ethylene glycol dimethacrylate, phenylene dimethacrylate, diethylene glycol dimethacrylate, triethylene glycol dimethacrylate, tetraethylene glycol dimethacrylate, polyethylene glycol 200 dimethacrylate, polyethylene glycol 400 dimethacrylate, 1,3-butanediol dimethacrylate, 1,4-butanediol dimethacrylate, 1,6-hexanediol dimethacrylate, 1,12-dodecanediol dimethacrylate, 1,3-glycerol dimethacrylate, diurethane dimethacrylate, trimethylolpropane trimethacrylate, bisphenol A epoxy diacrylate, dipropylene glycol diacrylate, tripropylene glycol diacrylate, polyethylene glycol 600 diacrylate, ethylene glycol diacrylate, diethylene glycol diacrylate, triethylene glycol diacrylate, tetraethylene glycol diacrylate, neopentyl glycol ethoxylate diacrylate, butanediol diacrylate, hexanediol diacrylate, aliphatic urethane diacrylate, trimethylolpropane triacrylate, trimethylolpropane ethoxylate triacrylate, trimethylolpropane propoxylate triacrylate, glycerol propoxylate triacrylate, aliphatic urethane triacrylate, trimethylolpropane triacrylate et dipentaerythritol pentaacrylate, triallyle cyanurate (TAC), triallyle isocyanurate (TAIC), N,N' m-phenylene dimaleimide, butadiene, chloroprene and isoprene.

More preferably, the coagent is chosen from the group consisting of: triallyl cyanurate, triallyl isocyanurate, N,N'-m-phenylenedimaleimide, triallyl trimellitate, trimethylolpropane triacrylate and trimethylolpropane trimethacrylate, preferably is selected in the group consisting of: triallyl cyanurate (TAC), triallyl isocyanurate (TAIC), trimethylolpropane triacrylate (TMPTA) and trimethylolpropane trimethacrylate (TMPTMA) and even more preferably is trimethylolpropane triacrylate (TMPTA).

Said coagent may be represent from 0.05% to 30%, preferably from 0.1% to 10% by weight relative to the total weight of the composition.

The main purpose of using a coagent in the composition of the present invention is to increase the level of crosslinking. This coagent also makes it possible to reduce residual gas emission during the decomposition of these same peroxides, and ultimately reduce the number of bubbles in the encapsulating film.

Preferably, the ratio by mass of organic peroxide and crosslinking coagent is within the range from 1:10 to 10:1, most preferably from 1:3 to 3:1.

The composition of this invention may further include additives such as coupling agents, UV stabilizers, UV absorbers, fillers, plasticizers, flame retardants, antioxidants, dyes and their mixtures. Examples of coupling agents are monoalkyl titanates, (vinyl)trichlorosilanes and (vinyl)trialkoxysilanes. They may represent from 0.01 to 5 wt. % relative to the weight of ethylene polymer. UV stabilizers may be chosen among hindered amine light stabilizers (HALS), whereas UV absorbers may be selected, for instance, from benzophenones, triazines and benzotriazoles. These compounds may represent from 0.01 to 3 wt. % relative to the weight of ethylene polymer. Inorganic fillers such as silicon dioxide, alumina, talc, calcium carbonate may be added to increase mechanical strength, although nanometric clays are preferred because of the transparency they provide. Examples of plasticizers are paraffinic or aromatic mineral oils, phthalates, azelates, adipates and the like. Antioxidants may be phenolic, phosphate or sulfur antioxidants. Alternatively, quinolines such as 1,2-dihydro-2,2,4-trimethylquinoline, may be used as an antioxidant.

According to a preferred embodiment, the composition of this invention does not include any aromatic peroxide such as dicumyl peroxide.

According to a preferred embodiment, the composition of the invention does not include any other peroxide than the at least monoperoxycarbonate (b) and the at least one t-alkyl hydroperoxide (c).

According to a preferred embodiment, the total amount of peroxide in the composition is less than 2 parts by weight for 100 parts by weight of constituent (a), more preferably less than 1.5 parts by weight for 100 parts by weight of constituent (a).

Still preferably, this composition consists of constituents (a), (b) and (c) above and optionally at least one of the following additives: a coupling agent, a UV stabilizer, a UV absorber, a filler, a plasticizer, a flame retardant, an antioxidant, a dye, a coagent and mixtures thereof.

According to another aspect, the disclosure pertains to a method of preparation of the composition as defined above, said method comprising a step of mixing the above constituents (a), (b) and (c). Advantageously, said step is achieved in conventional devices such as continuous mixers and compound extruders, preferably at a temperature below the degradation temperature of the peroxides of the invention.

It also pertains to the use of a t-alkyl hydroperoxide to prevent scorching of a curable composition comprising (a) at least one ethylene polymer, and (b) at least one monoperoxycarbonate, wherein the t-alkyl hydroperoxide represents from 0.4 to less than 4 parts by weight for 100 parts by weight of constituent (b), preferably from 0.5 to 3.5, preferably from 0.5 to 3, more preferably from 0.5 to 2 and even more preferably approximately 1 part by weight of constituent (c) for 100 parts by weight of constituent (b).

This invention is further directed to a method for preventing scorching of a curable composition comprising (a) at least one ethylene polymer, and (b) at least one monoperoxycarbonate, comprising the step of adding at least one t-alkyl hydroperoxide into the composition, in an amount of from 0.4 to less than 4 parts by weight for 100 parts by weight of constituent (b), preferably from 0.5 to 3.5, preferably from 0.5 to 3, more preferably from 0.5 to 2 and even more preferably approximately 1 part by weight of at least one t-alkyl hydroperoxide for 100 parts by weight of constituent (b).

In another aspect, the present invention relates to a method for manufacturing a scorch-protected material comprising an ethylene polymer, in particular for manufacturing a scorch-protected material selected in the group consisting of: encapsulating material or sealant, in particular solar cell encapsulating material or sealant, wire and cable insulation, pipes and hoses (including pipes for automobile radiators, drinkable water and under-floor heating, for instance), roller coverings, rotational moldings and foamed articles, said method comprising a step a) of curing a composition as defined above. Preferably said product is a solar cell encapsulating material or sealant.

Preferably, said curing step a) consists in a lamination step.

Preferably, step a) is carried out at a temperature from 130 to 180° C., more preferably from 140 to 165° C.

Preferably, said step a) lasts from 4 to 30 minutes, more preferably from 6 to 25 minutes.

Alternatively, said step a) lasts from 8 to 30 minutes, more preferably from 6 to 25 minutes.

Preferably, said method comprises a previous and/or simultaneous step a') chosen in the group consisting of molding, extrusion and injection of the composition as defined above. When the product is a solar cell encapsulating material or sealant, said step is preferably an extrusion step.

The step a') may be performed in such a way as to obtain a sheet having a thickness of from 50 to 2000 µm, preferably from 100 to 1000 µm, for instance.

Said step a') may be carried out with a T-die extruder or alternatively a twin-screw extruder coupled with a two-roll mill.

Preferably, step a') is carried out at a temperature from 80 to 150° C., more preferably from 90 to 120° C.

Preferably, no crosslinking is achieved during step a').

In a particular embodiment, steps a') and a) are carried out in a single step.

According to another embodiment, the present invention pertains to a method for manufacturing a photovoltaic module, said method comprising the step of pressing a laminate comprising successively:
- a front sheet (such as a glass sheet or PMMA sheet),
- a sheet comprising the composition of the invention,
- at least one solar cell (preferably made from crystalline silicon or organic photovoltaics),
- another sheet comprising the composition of the invention, and
- a backsheet (such as a multilayer PVDF/PET film or a glass sheet or a PMMA sheet).

This laminate may then be pressed by conventional techniques while heating and/or under vacuum, for instance at a temperature of from 130 to 180° C., more preferably from 140 to 165° C. under vacuum, for a curing time that may range from 4 to 30 minutes, for instance from 6 to 25 minutes. Alternatively, said step a) lasts from 8 to 30 minutes, more preferably from 6 to 25 minutes. The composition of the invention may be crosslinked during this pressing step of afterwards. Preferably, the method includes a single simultaneous step of pressing and curing.

In another aspect, the present invention relates to a scorch-protected material comprising an ethylene polymer obtainable by the method as defined above.

Preferably, said scorch-protected material comprising an ethylene polymer is selected in the group consisting of: encapsulating material or sealant, in particular solar cell encapsulating material or sealant, wire and cable insulation, pipes and hoses (including pipes for automobile radiators, drinkable water and under-floor heating, for instance), roller coverings, rotational moldings and foamed articles.

More preferably, said scorch-protected material comprising an ethylene polymer is a film, preferably an EVA film, and more preferably is an encapsulating material or sealant, and even more preferably is a solar cell encapsulating material or sealant.

The scorch-protected material comprising an ethylene polymer of the invention presents an improved crosslinking density of the ethylene polymer along with a marked decrease, if no absence, in the scorch issues. This thus permits to obtain films with no surface defect and which has good resistivity.

According to a further aspect, the invention pertains to a photovoltaic module comprising the scorch-protected material, preferably the solar cell encapsulating material, as defined above.

This invention will be better understood in light of the following examples which are given for illustrative purposes only and do not intend to limit the scope of the invention, which is defined by the attached claims.

EXAMPLES

Example 1: Scorch Protection Effect

Compositions according to this invention were prepared by mixing an ethylene/vinyl acetate (EVA) copolymer (Cosmothene® EVA KA-40 containing 28% VA, supplied by SUMITOMO) with OO-t-amyl-O-2-ethylhexyl-monoperoxycarbonate (Luperox® TAEC available from Arkema) and t-amyl hydroperoxide (Luperox® TAHP available from Arkema) in a Haake internal mixer at 35° C. for 12 minutes, using a stirring rate of 50 rpm/min. The polymeric mixture was then passed through an open mill set at 60° C. to produce sheets of about 2 mm thickness.

Samples of about 2 to 3 g of the above compositions were deposited in plate on a moving die rheometer (MDR) supplied by GOTECH, which is able to measure the cure properties of the samples and includes a software for analyzing the results. Each of the samples is placed in a temperature-controlled cavity between two dies, the lower of which oscillates to apply a cyclic stress or strain to the sample while the upper die is connected to a torque sensor to measure the torque response of the sample at the deformation. The stiffness is recorded continuously as a function of time. The stiffness of the sample increases as vulcanization proceeds.

This apparatus is able to provide, inter alia, calculated values of ML (minimum torque), MH (maximum torque), tc10 (time to 10% state of cure) and tc90 (time to 90% state of cure) as defined by International Standards (ASTM D5289 and ISO 6502).

The MDR was operated at 115° and 145° C. with an oscillation amplitude (deformation degree) of 0.5° applied to the sample for 30 min. The scorch time was defined as the time necessary to reach 10% of the total cure, i.e. tc10.

This experiment was conducted on the following samples, wherein the amounts of monoperoxycarbonate was indicated as parts per hundred parts of EVA resin (phr) and the amounts of TAHP as parts by weight for 100 parts by weight of monoperoxycarbonate:

TABLE 1

| TAEC | TAHP/TAEC (wt/wt) | MH (dN·m) at 115° C. | MH-ML (dN·m) at 145° C. | tc10 (m:s) at 145° C. | tc90 (m:s) at 145° C. |
|---|---|---|---|---|---|
| 0.5 phr | 0.02% | 1.27 | 1.8 | 1:03 | 8:52 |
| 0.5 phr | 0.4% | 1.17 | 1.82 | 1:05 | 8:58 |
| 0.5 phr | 0.98% | 1.15 | 1.86 | 1:07 | 9:21 |
| 0.5 phr | 1.38% | 1.06 | 1.82 | 1:09 | 9:27 |
| 0.5 phr | 2% | 0.63 | 1.8 | 1:17 | 9:31 |
| 0.5 phr | 4% | 0.35 | 1.74 | 1:43 | 9:43 |
| 0.5 phr | 5% | 0.32 | 1.60 | 2:31 | 10:58 |
| 0.7 phr | 0.02% | 1.45 | 2.02 | 0:56 | 9:50 |
| 0.7 phr | 0.2% | 1.41 | 1.99 | 1:00 | 10:00 |
| 0.7 phr | 0.98% | 1.31 | 1.96 | 1:05 | 10:10 |
| 0.7 phr | 2% | 1 | 1.96 | 1:12 | 10:18 |
| 0.7 phr | 4% | 0.37 | 1.91 | 1:40 | 10:42 |
| 1 phr | 0.02% | 1.68 | 2.22 | 0:55 | 10:48 |
| 1 phr | 0.2% | 1.63 | 2.24 | 0:56 | 10:56 |
| 1 phr | 0.98% | 1.53 | 2.19 | 1:00 | 10:48 |
| 1 phr | 2% | 1.24 | 2.21 | 1:09 | 11:24 |
| 1 phr | 4% | 0.43 | 2.13 | 1:33 | 11:45 |
| 1 phr | 5% | 0.42 | 1.85 | 1:45 | 13:30 |

From this table, it can be seen that TAHP acts as a scorch-protection agent since scorch time (tc10) increases with the amount of TAHP. When the amount of TAHP is below 0.4 wt % relative to TAEC, the crosslinking starts even at 115° C. (see MH values), which is not desired. However, there is a dramatic increase of the crosslinking time (tc90), and thus a lower crosslinking rate, when the latter reaches 4 wt % relative to TAEC and also a lower crosslinking density (MH). At values of TAHP below 4 wt % relative to TAEC, scorch is effectively prevented while maintaining a high crosslinking rate (tc90) and a good crosslinking density (MH-ML).

Example 2

The experiment was conducted in the same conditions as for example 1, except that a mixture of 20% of O,O-tert-butyl-O-(2-ethylhexyl)monoperoxycarbonate (TBEC) and 80% of O,O-tert-amyl-O-(2-ethylhexyl) monoperoxycarbonate (TAEC) was used instead of TAEC alone. The results are shown in the table 2 below:

TABLE 2

| TAEC + TBEC | TAHP/(TAEC + TBEC) (wt/wt) | MH (dN-m) at 115°) C. | MH-ML (dN-m) at 145° C. | tc10 (m:s) at 145° C. | tc90 (m:s) at 145° C. |
|---|---|---|---|---|---|
| 0.5 phr | 0.2% | 1.35 | 1.87 | 0:58 | 9:57 |
| 0.5 phr | 0.6% | 1.15 | 1.88 | 1:08 | 10:06 |
| 0.5 phr | 1% | 0.96 | 1.89 | 1:14 | 10:19 |
| 0.5 phr | 2% | 0.56 | 1.88 | 1:22 | 10:18 |
| 0.5 phr | 4% | 0.36 | 1.84 | 1:48 | 11:06 |
| 0.7 phr | 0% | 1.65 | 2.1 | 0:58 | 10:31 |
| 0.7 phr | 0.2% | 1.6 | 2.03 | 1:04 | 10:42 |
| 0.7 phr | 0.6% | 1.38 | 1.99 | 1:07 | 10:55 |
| 0.7 phr | 1% | 1.07 | 1.98 | 1:12 | 11:12 |
| 0.7 phr | 2% | 0.65 | 1.97 | 1:21 | 11:26 |
| 0.7 phr | 4% | 0.41 | 1.95 | 1:44 | 12:14 |
| 1 phr | 0% | 1.6 | 2.28 | 0:55 | 11:36 |
| 1 phr | 0.2% | 1.58 | 2.26 | 0:58 | 11:45 |
| 1 phr | 0.6% | 1.37 | 2.25 | 1:01 | 11:57 |
| 1 phr | 1% | 1.24 | 2.24 | 1:05 | 12:12 |
| 1 phr | 2% | 0.81 | 2.22 | 1:16 | 12:25 |
| 1 phr | 4% | 0.38 | 2.19 | 1:41 | 13:10 |

As for the previous example, there is a dramatic increase of the crosslinking time (tc90), when the latter reaches 4 wt % relative to TAEC+TBEC.

Example 3

The experiment was conducted in the same conditions than for example 1, except that a mixture of 50% of O,O-tert-butyl-O-(2-ethylhexyl)monoperoxycarbonate (TBEC) and 50% of O,O-tert-amyl-O-(2-ethylhexyl) monoperoxycarbonate (TAEC) was used instead of TAEC alone. The results are shown in the table 3 below:

TABLE 3

| TAEC + TBEC | TAHP/(TAEC + TBEC) (wt/wt) | MH (dN·m) at 115° C. | MH-ML (dN·m) at 145° C. | tc10 (m:s) at 145° C. | tc90 (m:s) at 145° C. |
|---|---|---|---|---|---|
| 0.5 phr | 0% | 1.30 | 1.83 | 0:58 | 9:16 |
| 0.5 phr | 1% | 1.02 | 1.87 | 1:10 | 9:36 |
| 0.5 phr | 4% | 0.36 | 1.81 | 1:40 | 10:21 |
| 0.7 phr | 0% | 1.45 | 1.99 | 0:58 | 9:55 |
| 0.7 phr | 0.6% | 1.29 | 1.97 | 1:03 | 10:03 |
| 0.7 phr | 1% | 1.19 | 1.92 | 1:15 | 10:17 |
| 0.7 phr | 4% | 0.36 | 1.88 | 1:42 | 10:47 |
| 1 phr | 0% | 1.65 | 2.28 | 0:58 | 11:12 |

TABLE 3-continued

| TAEC + TBEC | TAHP/ (TAEC + TBEC) (wt/wt) | MH (dN·m) at 115° C. | MH-ML (dN·m) at 145° C. | tc10 (m:s) at 145° C. | tc90 (m:s) at 145° C. |
|---|---|---|---|---|---|
| 1 phr | 0.6% | 1.49 | 2.23 | 1:02 | 11:18 |
| 1 phr | 1% | 1.4 | 2.22 | 1:08 | 11:21 |
| 1 phr | 4% | 0.41 | 2.13 | 1:33 | 11:56 |

As for the previous examples, there is a dramatic increase of the crosslinking time (tc90), when the latter reaches 4 wt % relative to TAEC+TBEC.

Example 4

The experiment was conducted in the same conditions than for example 1, except that Lup@TBHP (tert-butyl hydroperoxide) was used instead of TAHP. The results are shown in the table 4 below:

TABLE 4

| TAEC | TBHP/ TAEC (wt/wt) | MH (dN·m) at 115° C. | MH-ML (dN·m) at 145° C. | tc10 (m:s) at 145° C. | tc90 (m:s) at 145° C. |
|---|---|---|---|---|---|
| 0.5 phr | 0.02% | 1.25 | 1.79 | 1:02 | 8:50 |
| 0.5 phr | 0.4% | 1.18 | 1.83 | 1:06 | 8:55 |
| 0.5 phr | 1% | 1.17 | 1.86 | 1:07 | 9:21 |
| 0.5 phr | 2% | 0.62 | 1.81 | 1:19 | 9:35 |
| 0.5 phr | 4% | 0.37 | 1.75 | 1:45 | 9:59 |
| 0.5 phr | 5% | 0.31 | 1.59 | 2:35 | 10:59 |
| 0.7 phr | 0.02% | 1.44 | 2.01 | 0:57 | 9:52 |
| 0.7 phr | 0.2% | 1.40 | 1.97 | 1:02 | 10:05 |
| 0.7 phr | 1% | 1.30 | 1.96 | 1:06 | 10:10 |
| 0.7 phr | 2% | 1.02 | 1.95 | 1:15 | 10:20 |
| 0.7 phr | 4% | 0.36 | 1.93 | 1:45 | 10:45 |
| 1 phr | 0.02% | 1.65 | 2.21 | 0:55 | 10:45 |
| 1 phr | 0.2% | 1.62 | 2.25 | 0:57 | 10:58 |
| 1 phr | 1% | 1.53 | 2.18 | 1:02 | 10:46 |
| 1 phr | 2% | 1.25 | 2.20 | 1:08 | 11:25 |
| 1 phr | 4% | 0.42 | 2.14 | 1:32 | 11:42 |
| 1 phr | 5% | 0.40 | 1.82 | 1:43 | 13:28 |

As for the previous examples, there is a dramatic increase of the crosslinking time (tc90), when the latter reaches 4 wt % relative to TAEC pure.

Example 5

The experiment was conducted in the same conditions than for example 4, except that a mixture of 20% of O,O-tert-butyl-O-(2-ethylhexyl)monoperoxycarbonate (TBEC) and 80% of O,O-tert-amyl-O-(2-ethylhexyl) monoperoxycarbonate (TAEC) was used instead of TAEC alone. The results are shown in the table 5 below:

TABLE 5

| TAEC + TBEC | TBHP/ (TAEC + TBEC) (wt/wt) | MH (dN-m) at 115°) C. | MH-ML (dN-m) at 145° C. | tc10 (m:s) at 145° C. | tc90 (m:s) at 145° C. |
|---|---|---|---|---|---|
| 0.5 phr | 0.2% | 1.32 | 1.89 | 0:57 | 9:56 |
| 0.5 phr | 0.6% | 1.16 | 1.88 | 1:05 | 10:05 |
| 0.5 phr | 1% | 0.95 | 1.88 | 1:12 | 10:12 |
| 0.5 phr | 2% | 0.55 | 1.88 | 1:23 | 10:15 |
| 0.5 phr | 4% | 0.37 | 1.85 | 1:47 | 11:08 |
| 0.7 phr | 0% | 1.62 | 2.1 | 0:58 | 10:31 |
| 0.7 phr | 0.2% | 1.61 | 2.01 | 1:02 | 10:40 |
| 0.7 phr | 0.6% | 1.42 | 1.99 | 1:09 | 10:54 |
| 0.7 phr | 1% | 1.12 | 1.98 | 1:15 | 11:13 |
| 0.7 phr | 2% | 0.7 | 1.98 | 1:20 | 11:25 |
| 0.7 phr | 4% | 0.45 | 1.94 | 1:41 | 12:12 |
| 1 phr | 0% | 1.61 | 2.27 | 0:54 | 11:36 |
| 1 phr | 0.2% | 1.59 | 2.25 | 0:59 | 11:47 |
| 1 phr | 0.6% | 1.38 | 2.26 | 1:02 | 11:55 |
| 1 phr | 1% | 1.26 | 2.23 | 1:04 | 12:13 |
| 1 phr | 2% | 0.85 | 2.23 | 1:15 | 12:24 |
| 1 phr | 4% | 0.40 | 2.20 | 1:42 | 13:15 |

As for the previous examples, there is a dramatic increase of the crosslinking time (tc90), when the latter reaches 4 wt % relative to TAEC+TBEC.

Example 6

The experiment was conducted in the same conditions than for example 4, except that a mixture of 50% of O,O-tert-butyl-O-(2-ethylhexyl)monoperoxycarbonate (TBEC) and 50% of O,O-tert-amyl-O-(2-ethylhexyl) monoperoxycarbonate (TAEC) was used instead of TAEC alone. The results are shown in the table 6 below:

TABLE 6

| TAEC + TBEC | TBHP/ (TAEC + TBEC) (wt/wt) | MH (dN·m) at 115° C. | MH-ML (dN·m) at 145° C. | tc10 (m:s) at 145° C. | tc90 (m:s) at 145° C. |
|---|---|---|---|---|---|
| 0.5 phr | 0% | 1.25 | 1.85 | 0:55 | 9:15 |
| 0.5 phr | 1% | 1.05 | 1.82 | 1:12 | 9:38 |
| 0.5 phr | 4% | 0.35 | 1.78 | 1:41 | 10:22 |
| 0.7 phr | 0% | 1.41 | 1.98 | 0:57 | 9:51 |
| 0.7 phr | 0.6% | 1.32 | 1.96 | 1:05 | 10:00 |
| 0.7 phr | 1% | 1.21 | 1.93 | 1:16 | 10:16 |
| 0.7 phr | 4% | 0.39 | 1.87 | 1:45 | 10:52 |
| 1 phr | 0% | 1.66 | 2.27 | 0:57 | 11:10 |
| 1 phr | 0.6% | 1.48 | 2.24 | 1:02 | 11:18 |
| 1 phr | 1% | 1.37 | 2.23 | 1:09 | 11:20 |
| 1 phr | 4% | 0.42 | 2.10 | 1:35 | 11:59 |

As for the previous examples, there is a dramatic increase of the crosslinking time (tc90), when the latter reaches 4 wt % relative to TAEC+TBEC.

Example 7

The experiment was conducted in the same conditions as for example 1, except that OO-t-amyl-O-2-isopropyl-monoperoxycarbonate (TRIC) was used instead of TAEC. The results are shown in the table 7 below:

TABLE 7

| TAIC | TAHP/ TAIC (wt/wt) | MH (dN·m) at 115° C. | MH-ML (dN·m) at 145° C. | tc10 (m:s) at 145° C. | tc90 (m:s) at 145° C. |
|---|---|---|---|---|---|
| 0.5 phr | 0 | 1.2 | 1.79 | 00:50 | 07:45 |
| 0.5 phr | 0.65% | 1.1 | 1.76 | 01:00 | 08:05 |
| 0.5 phr | 1% | 1.05 | 1.7 | 01:10 | 08:20 |

From this table, it can be seen that with the addition of at least 0.4% wt of TAHP relative to TAEC, scorch is effectively prevented while maintaining a high crosslinking rate (tc90) and a good crosslinking density (MH-ML).

Example 8

The experiment was conducted in the same conditions as for example 1, except that a mixture of 60% of O,O-t-amyl-O-2-isopropyl-monoperoxycarbonate (TAIC) and 40% of O,O-tert-amyl-O-(2-ethylhexyl) monoperoxycarbonate (TAEC) was used instead of TAEC alone. The results are shown in the table 8 below:

TABLE 8

| 60% TAIC + 40% TAEC | TAHP/ TAIC + TAEC (wt/wt) | MH (dN · m) at 115° C. | MH-ML (dN · m) at 145° C. | tc10 (m:s) at 145° C. | tc90 (m:s) at 145° C. |
|---|---|---|---|---|---|
| 0.5 phr | 0 | 1.18 | 1.76 | 00:58 | 08:10 |
| 0.5 phr | 0.70% | 1.1 | 1.72 | 01:10 | 08:32 |
| 0.5 phr | 1% | 1 | 1.65 | 01:20 | 08:40 |

From this table, it can be seen that with the addition of at least 0.4% wt of TAHP relative to TAIC, scorch is effectively prevented while maintaining a high crosslinking rate (tc90) and a good crosslinking density (MH-ML).

Example 9

The experiment was conducted in the same conditions as for example 1, except that polyolefin elastomer (KJ640T 27255C manufactured by JAPAN POLYETHYLENE CORPORATION) was used instead of EVA. The results are shown in the table 9 below:

TABLE 9

| TAEC | TAHP/ TAEC (wt/wt) | MH (dN · m) at 115° C. | MH-ML (dN · m) at 145° C. | tc10 (m:s) at 145° C. | tc90 (m:s) at 145° C. |
|---|---|---|---|---|---|
| 0.5 phr | 0.02% | 0.3 | 1.35 | 02:00 | 17:00 |
| 0.5 phr | 0.40% | 0.28 | 1.31 | 02:15 | 17:10 |
| 0.5 phr | 0.98% | 0.26 | 1.28 | 02:25 | 17:20 |

From this table, it can be seen that with the addition of at least 0.4% wt of TAHP relative to TAEC, scorch is effectively prevented while maintaining a high crosslinking rate (tc90) and a good crosslinking density (MH-ML).

Example 10

The experiment was conducted in the same conditions as for example 9, except that O,O-tert-butyl-O-(2-ethylhexyl) monoperoxycarbonate (TBEC) was used instead of O,O-tert-amyl-O-(2-ethylhexyl) monoperoxycarbonate (TAEC). The results are shown in the table 10 below:

TABLE 10

| TBEC | TBHP/ TBEC (wt/wt) | MH (dN · m) at 115° C. | MH-ML (dN · m) at 145° C. | tc10 (m:s) at 145° C. | tc90 (m:s) at 145° C. |
|---|---|---|---|---|---|
| 0.5 phr | 0.20% | 0.29 | 1.1 | 03:00 | 22:00 |
| 0.5 phr | 0.60% | 0.26 | 1 | 03:11 | 22:13 |
| 0.5 phr | 1% | 0.24 | 0.95 | 03:18 | 22:25 |

From this table, it can be seen that with the addition of at least 0.4% wt of TBHP relative to TBEC, scorch is effectively prevented while maintaining a high crosslinking rate (tc90) and a good crosslinking density (MH-ML).

Example 11

The experiment was conducted in the same conditions as for example 9, except that O,O-t-amyl-O-2-isopropyl-monoperoxycarbonate (TAIC) was used instead of 0,0-tert-amyl-O-(2-ethylhexyl) monoperoxycarbonate (TAEC). The results are shown in the table 11 below:

TABLE 11

| TAIC | TAHP/TAIC (wt/wt) | MH (dN · m) at 115° C. | MH-ML (dN · m) at 145° C. | tc10 (m:s) at 145° C. | tc90 (m:s) at 145° C. |
|---|---|---|---|---|---|
| 0.5 phr | 0 | 0.38 | 1.73 | 01:50 | 14:20 |
| 0.5 phr | 0.65% | 0.35 | 1.68 | 02:00 | 14:27 |
| 0.5 phr | 1% | 0.31 | 1.62 | 02:12 | 14:36 |

From this table, it can be seen that with the addition of at least 0.4% wt of TAHP relative to TAIC, scorch is effectively prevented while maintaining a high crosslinking rate (tc90) and a good crosslinking density (MH-ML).

Example 12

The experiment was conducted in the same conditions as for example 9, except that O,O-t-butyl-O-2-isopropyl-monoperoxycarbonate (TBIC) was used instead of 0,0-tert-amyl-O-(2-ethylhexyl) monoperoxycarbonate (TAEC). The results are shown in the table 12 below:

TABLE 12

| TBIC | TBHP/ TBIC (wt/wt) | MH (dN · m) at 115° C. | MH-ML (dN · m) at 145° C. | tc10 (m:s) at 145° C. | tc90 (m:s) at 145° C. |
|---|---|---|---|---|---|
| 0.5 phr | 0 | 0.31 | 1.66 | 02:45 | 20:00 |
| 0.5 phr | 0.70% | 0.28 | 1.6 | 02:58 | 20:10 |
| 0.5 phr | 1% | 0.26 | 1.57 | 03:06 | 20:15 |

From this table, it can be seen that with the addition of at least 0.4% wt of TBHP relative to TBIC, scorch is effectively prevented while maintaining a high crosslinking rate (tc90) and a good crosslinking density (MH-ML).

The invention claimed is:
1. A curable composition comprising:
   a) at least one ethylene polymer,
   b) from more than 0 to less than 2 parts by weight of at least one monoperoxycarbonate for 100 parts by weight of constituent (a),
   c) from 0.4 to less than 4 parts by weight of at least one t-alkyl hydroperoxide for 100 parts by weight of constituent (b).
2. The composition of claim 1, wherein the ethylene polymer is an ethylene/vinyl acetate copolymer.
3. The composition of claim 1, wherein the ethylene polymer is a polyolefin elastomer.
4. The composition of claim 1, wherein the monoperoxycarbonate is an OO-t-alkyl-O-alkyl monoperoxycarbonate.
5. The composition according to claim 4, wherein the OO-t-alkyl-O-alkyl monoperoxycarbonate is selected from the group consisting of: OO-t-butyl-O-2-ethylhexyl-monoperoxycarbonate (TBEC), OO-t-butyl-O-2-isopropyl-monoperoxycarbonate (TBIC), OO-t-amyl-O-2-ethylhexyl- monoperoxycarbonate (TAEC), OO-t-amyl-O-2-isopropyl-monoperoxycarbonate (TAIL) and mixtures thereof.

6. The composition of claim 1, wherein the monoperoxycarbonate is from 0.1 to less than 2 parts by weight of constituent (a).

7. The composition of claim 1, wherein the t-alkyl hydroperoxide is selected from the group consisting of: t-butyl hydroperoxide (TBHP), t-amyl hydroperoxide (TAHP), t-hexyl hydroperoxide (THHP), 1,1,3,3-tetramethylbutyl hydroperoxide (TOHP), paramenthane hydroperoxide (PMHP), 2,5-dimethyl-2,5-di-hydroperoxide (2,5-2,5) and mixtures thereof.

8. The composition of claim 1, comprising from 0.5 to 3.5 parts by weight of constituent (c) for 100 parts by weight of constituent (b).

9. The composition of claim 1, further comprising one co-agent selected in the group consisting of: triallyl cyanurate, triallyl isocyanurate, N,N'-m-phenylenedimaleimide, triallyl trimellitate, trimethylolpropane triacrylate and trimethylolpropane trimethacrylate.

10. A method for preventing scorching of a curable composition comprising (a) at least one ethylene polymer, and (b) from more than 0 to less than 2 parts by weight of at least one monoperoxycarbonate for 100 parts by weight of constituent (a), comprising the step of adding at least one t-alkyl hydroperoxide into the composition, in an amount of from 0.4 to less than 4 parts by weight for 100 parts by weight of constituent (b).

11. A method for manufacturing a scorch-protected material comprising an ethylene polymer, said method comprising a step a) of curing a composition comprising:
   (a) at least one ethylene polymer,
   (b) from more than 0 to less than 2 parts by weight of at least one monoperoxycarbonate for 100 parts by weight of constituent (a), and
   (c) from 0.4 to less than 4 parts by weight of at least one t-alkyl hydroperoxide for 100 parts by weight of constituent (b).

12. The method according to claim 11, further comprising a previous and/or simultaneous step a'), wherein step a') is selected from the group consisting of: molding, extruding and injecting the composition.

13. The method according to claim 12, wherein step a') is carried out at a temperature from 80 to 150° C.

* * * * *